United States Patent [19]

Niggemann

[11] Patent Number: 4,962,444
[45] Date of Patent: Oct. 9, 1990

[54] COLD CHASSIS FOR COOLING ELECTRONIC CIRCUIT COMPONENTS ON AN ELECTRONIC BOARD

[75] Inventor: Richard E. Niggemann, Rockford, Ill.

[73] Assignee: Sunstrand Corporation, Rockford, Ill.

[21] Appl. No.: 293,129

[22] Filed: Jan. 3, 1989

[51] Int. Cl.$^5$ .............................................. H05K 7/20
[52] U.S. Cl. ........................................ 361/382; 165/80.4; 357/82; 361/385; 361/389; 361/415; 361/429
[58] Field of Search .......................... 165/80.4, 104.33; 174/15.1, 15.2; 211/41; 357/82; 361/381–389, 412, 414, 415, 429

[56] References Cited

U.S. PATENT DOCUMENTS

| | | | |
|---|---|---|---|
| 3,631,325 | 12/1971 | Wenz | 361/386 |
| 4,315,300 | 2/1982 | Parmerlee et al. | 361/382 |
| 4,494,171 | 1/1985 | Bland et al. | 361/386 |
| 4,520,426 | 5/1985 | Wessely | 361/386 |
| 4,525,770 | 6/1985 | Perretta | 361/399 |
| 4,550,836 | 11/1985 | Ellis | 211/41 |

FOREIGN PATENT DOCUMENTS 0661874  5/1979  U.S.S.R. .............................. 361/382

OTHER PUBLICATIONS

Corderman, "Water Jacket Conduction Cooling", IBM Technical Disclosure Bulletin vol. 22, No. 1, Jun. 1979, pp. 206–207.

Primary Examiner—Gregory D. Thompson
Attorney, Agent, or Firm—Wood, Phillips, Mason, Recktenwald & Vansanten

[57] ABSTRACT

The problem of providing a compact high intensity cooling system for use with a cold chassis (42) for an electronic board (18) in a modular electronic system is solved by providing a frame (44) having a plurality of projecting ribs (46) defining grooves (48) for receiving edges of electronic boards. The ribs each include a plurality of impingement orifice plates (66a, 66b), spacer plates (68) and manifold plates (70a, 70b). The impingement orifice plates and the spacer plates cooperate to define first and second tortuous flow paths generally parallel to each other and perpendicularly to the plates for dual cooling fluid circuits. The manifold plates are disposed at opposite ends of the stack and define flow passages for distributing the cooling fluid to the tortuous flow paths. Inlets (78, 80) and outlets (90, 92) to and from the flow passages (72, 74) of the manifold plates are provided at a common edge of the stack of plates in communication directly through the frame to headers (50, 52, 54, 56) on the opposite side of the frame.

29 Claims, 5 Drawing Sheets

COLD CHASSIS FOR COOLING ELECTRONIC CIRCUIT COMPONENTS ON AN ELECTRONIC BOARD

FIELD OF THE INVENTION

This invention generally relates to a cooling system for electronic circuit components and, particularly, to a cooling system including a chassis having cold ribs for cooling an electronic board in a modular electronic system.

BACKGROUND OF THE INVENTION

There is a constant demand for smaller electronic components and/or modules, particularly in the aircraft or aerospace fields, where size and weight are of critical importance. Microelectronics offers a great reduction in size and weight of electronic components where the components are mounted on boards including integrated circuitry.

One of the first steps in size and cost reduction was the modular concept where electronic plug-in modules were developed to meet various system requirements. Standard hardware designs were provided to have a plurality of modules which plug in a chassis to form an assembly. Normally, these plug-in modules slide in grooves in the chassis and may engage a mating female connector. These modules are closely assembled and dissipate considerable heat which, if not removed, greatly affects component reliability.

This problem of dissipating heat has been approached by various attempts to cool the electronic assemblies, ranging from some type of cooling fan assembly to cooling coils.

One approach for improving the cooling arrangement for an electronic plug-in module assembly is shown in U.S. Pat. No. 4,315,300 to Parmerlee et al, dated Feb. 9, 1982. This patent shows an arrangement where a plurality of modules are supported in grooves defined by a pair of parallel sides of a chassis. Each parallel side is provided with fluid passageways for carrying a cooling liquid for removing heat transferred from a heat sink on each module to the sides of the grooves. A plurality of apertures are provided in each side between adjacent grooves and carry fins through which cool air is blown to cool each side of each plug-in module. Such arrangements may be adequate for some electronic components, but they simply are insufficient for advanced components, such as "supercomputers", radar or other systems where 200–500 watts of heat are anticipated to be generated by each module. Such prior arrangements where the chassis and/or sides of the grooves are fabricated of solid material, such as aluminum, simply cannot dissipate heat from such advanced components.

This invention is directed to solving this problem of cooling electronic components on an electronic board by providing cooling ribs forming grooves on the chassis, with the ribs being fabricated of a stack of impingement orifice plates which provide for extremely compact high intensity cooling.

SUMMARY OF THE INVENTION

An object, therefore, of the invention is to provide a new and improved chassis for cooling electronic circuit components on an electronic board.

Generally, in the exemplary embodiment of the invention, the chassis includes a frame having a plurality of projecting ribs defining at least one groove for receiving an edge of the electronic board, with the board in engagement with at least one of the ribs. At least the one rib includes a plurality of spaced impingement orifice plates defining a tortuous flow path through the rib. Inlet and outlet means are provided from the frame to the flow path for a cooling fluid to flow through the impingement orifice plates and exchange heat with the electronic board.

As disclosed herein, the chassis rib is fabricated entirely of a stack of plates including impingement orifice plates, spacer plates and manifold plates. The impingement orifice plates and the spacer plates cooperate to define the tortuous flow path perpendicularly through the plates for the cooling fluid. The manifold plates are disposed at opposite ends of the stack and have channel means defining flow passage means generally parallel to the plates for distributing the fluid to the tortuous flow path. The inlet and outlet means are located at an edge of the stack of plates in communication with the channel means defining the flow passage means of the manifold plates.

Preferably, a pair of tortuous flow paths are defined through the orifice plates, with corresponding independent flow passage means from the manifold plates and separate inlet and outlet means to provide two distinct cooling medium circuits. This provides redundant circuits in the event that one circuit fails, such as with a rupture or the like.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

FIG. 8 is a view similar to that of FIG. 3 when only one circuit is operating with the prior art chassis; and FIG. 9 is a view similar to that of FIG. 7 when only one circuit is operating with the chassis of the invention.

DETAILED DESCRIPTION OF THE PREFERRED EMBODIMENT

Figure 1:
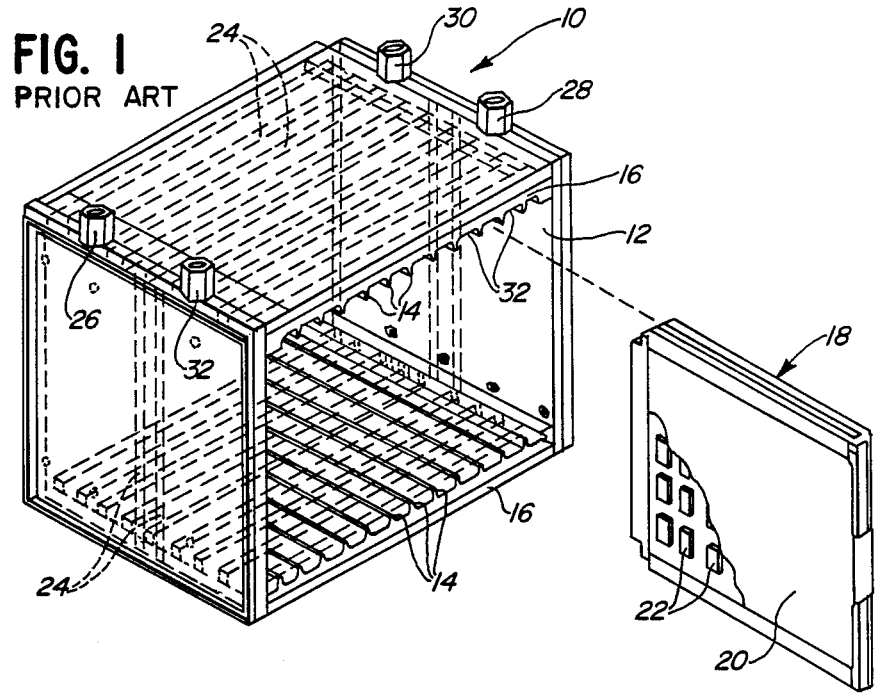
FIG. 1 is a perspective view of a cold chassis, according to the prior art, for cooling an electronic board.

Referring to the drawings in greater detail, and first to FIG. 1, a prior art cold chassis, generally designated 10, is shown in a rectangular box configuration defining an interior cavity 12 having ribs 14 on the inside of the top and bottom walls or frame components 16. The ribs form grooves therebetween for receiving an electronic board, generally designated 18, in a modular fashion as is conventional and as described earlier herein. In other words, boards 18 form plug-in modules which slide in the grooves between ribs 14 of chassis 10 and may engage a mating female connector. These modules are closely assembled and dissipate considerable heat which, if not removed, greatly affects component reliability. The chassis of FIG. 1 may differ somewhat from the aforedescribed U.S. Pat. No. 4,315,300, but the principles of a solid ribbed chassis are substantially the same.

More particularly, module 18 generally comprises an aluminum plate 20 used as a cold plane for mounting electronic components 22 on the backside thereof. The electronic components are attached to the cold plane either to form a single or a double sided line replaceable module. The electronic components generate heat which is absorbed by the aluminum cold plane and conducted to its edges which are mechanically clamped to aluminum ribs 14 of chassis 10. The ribs and frame walls 16, in turn, are fabricated of solid aluminum and include channels shown by dotted lines 24 to provide a circuit to conduct the heat to a coolant flowing through the channels.

In the prior art configuration of FIG. 1, a dual coolant path is provided with an inlet 26 and an outlet 28 for a first coolant path, and an inlet 30 and an outlet 32 for a second coolant path. These redundant flow paths or circuits are provided for safety or reliability purposes in the event that a rupture occurs in one of the coolant circuits.

Figure 2:
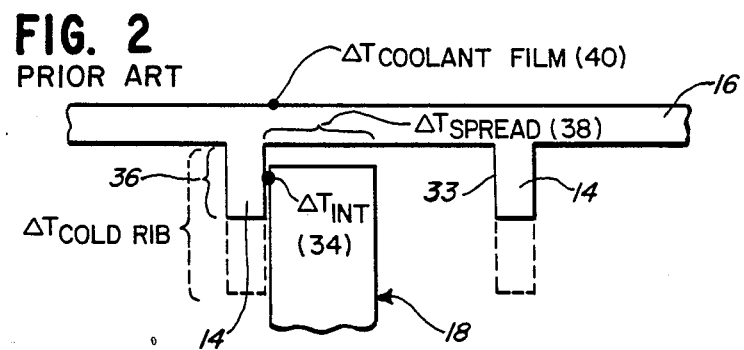
FIG. 2 is a schematic illustration of the areas of temperature drops across the ribbed configuration of the prior art chassis.

FIG. 2 shows one of the grooves or ribbed areas of the prior art cold chassis of FIG. 1, in somewhat schematic illustration. In other words, one of the frame walls 16 is shown with a pair of ribs 14 forming a groove 33 for receiving electronic board 18. The flow passages for the coolant are not shown in order to avoid cluttering the illustration which is provided simply to show the locations of temperature differentials or temperature drops as heat is dissipated from board 18 through the chassis. In addition, the normal height of a rib 14 is shown in full lines, and ribs of twice the normal height are shown dotted.

More particularly, the temperature differential, temperature drop or loss ($\Delta T$), as heat is dissipated from electronic board 18 through the chassis, occurs at four areas or locations.

As shown in FIG. 2, one area of temperature drop is located at 34, namely "$\Delta T$ INT.". This is the temperature drop at the interface between circuit board 18 and the rib with which it is engaged. A second area of temperature drop is located at 36 which represents the temperature drop along the width (actually the length as viewed in the drawing) of the rib. A third area of temperature drop is located in frame 16 at 38 and represents the temperature drop in the solid aluminum material defined by the width of board 18. It can be seen that "$\Delta T$ Spread" is only one-half the width of groove 33, because these representations are being used to illustrate the temperature differential at a single rib 14. A fourth area of temperature drop is identified at 40 and schematically represents the temperature differential between the aluminum material and the coolant itself.

Figure 3:
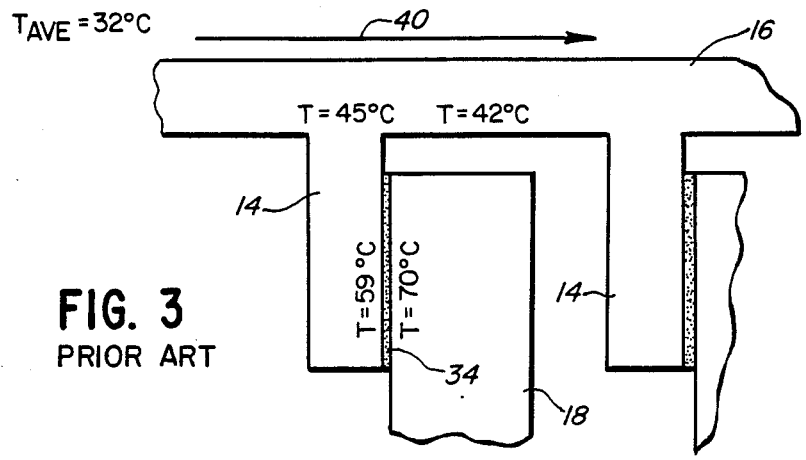
FIG. 3 is a view similar to that of FIG. 2, showing temperature differential values at the areas located in FIG. 2.

FIG. 3 is a schematic illustration similar to that of FIG. 2, but showing actual temperature values calculated from a preliminary analysis conducted on the prior art solid aluminum chassis configuration of FIG. 1 for 180 watts per cold rib. It also should be pointed out that, in order to emphasize the improvement of the invention over the prior art, the efficiency of the prior art chassis was enhanced by doubling the normal rib height of rib 14 and providing enhanced contact at interface 34 between electronic board 18 and the rib. It can be seen that the temperature of electronic board 18 at interface 34 is 70° C. and the temperature of the rib is 59° C. Therefore, the temperature drop at interface 34 is 11° C. The temperature at the base of rib 14 is 45° C., resulting in a temperature drop along rib 14 of 14° C. The temperature drops to 42° C. across the width of electronic board 18 at frame 16, resulting in a temperature differential of 3° C. Lastly, the "film" temperature differential between the aluminum material and the coolant as the coolant flows through the chassis (arrow "A") is 10° C. as the coolant temperature is indicated at 32° C. From the foregoing, it can be seen that the temperature differential or drop from circuit board 18 at interface 34 to coolant 40 is an overall differential of 38° C. Lastly, it should be noted that these calculations were made with a chassis utilizing a dual circuit or redundant flow path as shown in FIG. 1.

Figure 4:
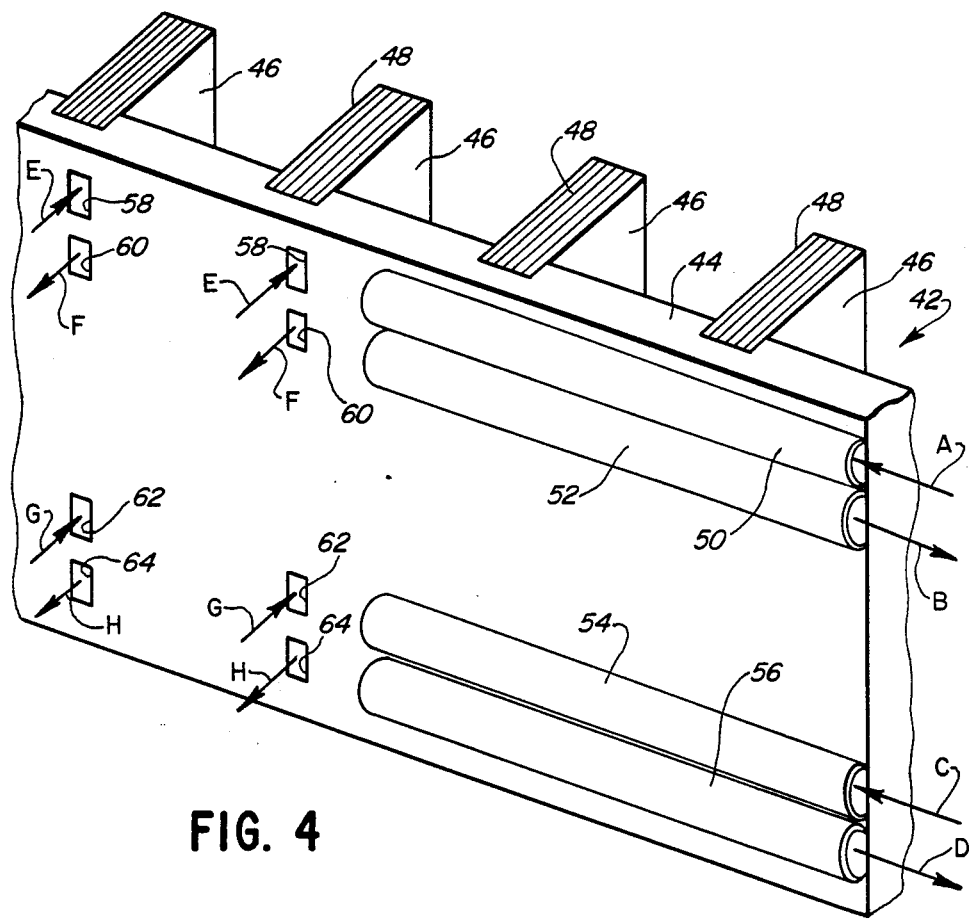
FIG. 4 is a fragmented perspective view of a ribbed chassis configuration embodying the concepts of the invention.

FIG. 4 shows somewhat schematically a fragmented portion of a cold chassis, generally designated 42, incorporating the concepts of the invention. More particularly, the chassis includes a frame 44 and a plurality of ribs 46 defining grooves 48 between the ribs, similar to a conventional modular plug-in chassis as described in relation to FIG. 1 which has frame members 16, ribs 14 and grooves 32. However, frame 44 is provided with headers or manifolds 50,52,54 and 56 which either may be interior of the frame or exteriorly as shown. By providing the manifolds exteriorly of the frame, obviously the frame can be made thinner. These four manifolds provide inlet means and outlet means, as indicated by arrows "A" and "B", respectively, for coolant in a first circuit, and inlet means and outlet means as indicated by arrows "C" and "D", respectively, for coolant in a second or redundant circuit, as will be described in greater detail hereinafter.

In addition, frame 44 has pairs of passages, each pair including a passage 58 and 60, extending transversely therethrough. Each pair of passages 58 and 60 communicate with the interior of a respective rib 46, as described hereinafter. It can be seen that manifolds 50 and 52 run parallel to frame 44 and perpendicularly to ribs 46. The manifolds are in line with passages 58 and 60. In other words, as shown, inlet manifold 50 spans passages 58 and outlet manifold 52 spans passages 60. Therefore, passages 58 define inlet means, as indicated by arrows "E" to the respective ribs, and passages 60 define outlet means, as indicated by arrows "F" through frame 44 from the respective ribs. Similarly, additional pairs of passages 62 and 64 for each rib 46 are provided through frame 44, with one pair of passages 62,64 for each rib 46 and communicating respectively with inlet manifold 54 and outlet manifold 56. Therefore, a redundant circuit is provided as indicated by inlet arrows "G" and outlet arrows "H" communicating ribs 46 with inlet manifold 50 through inlet passages 62 and outlet manifold 56 through outlet passages 64.

Figure 5:
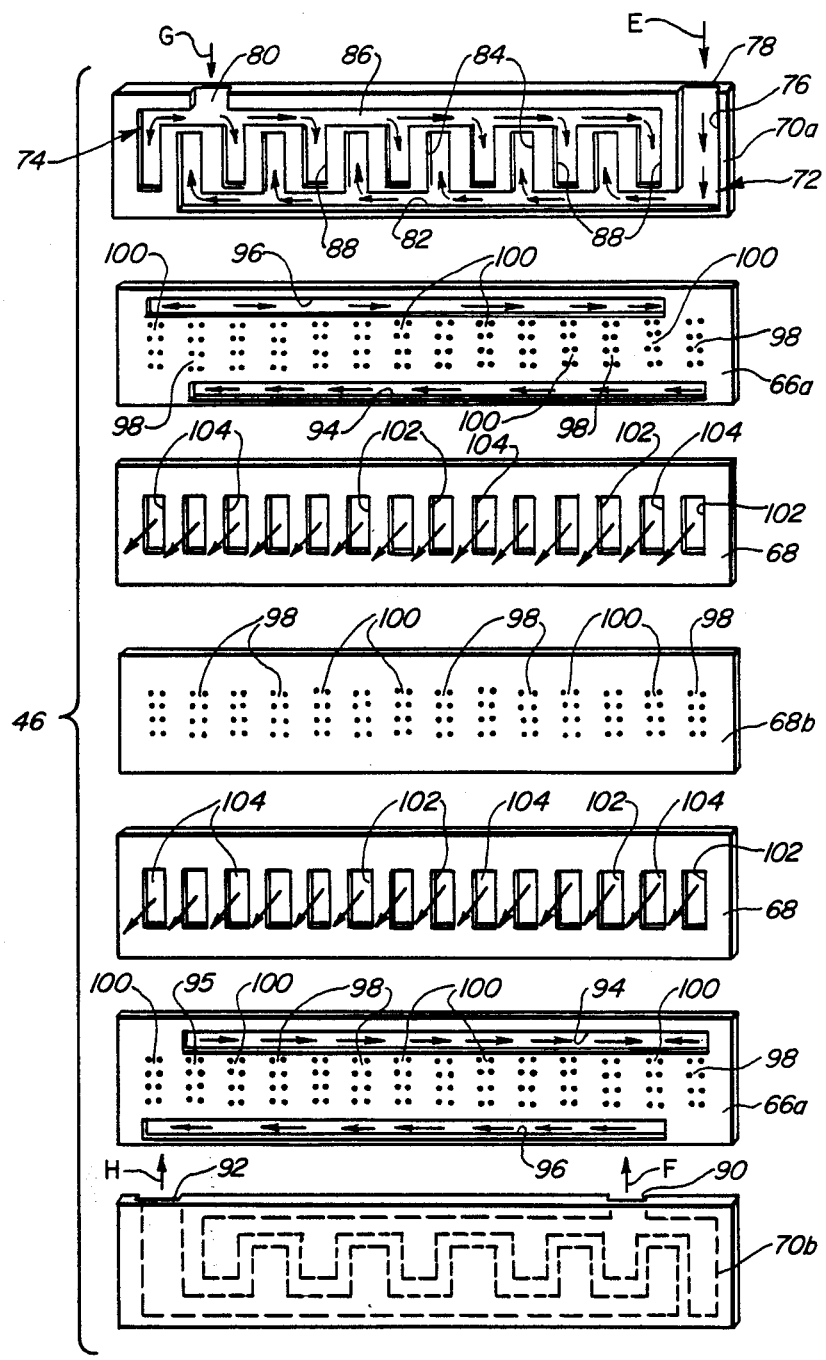
FIG. 5 is an exploded view of the stack of plates forming the chassis cold ribs of the invention.

The invention contemplates that each rib 46 provide for compact high intensity cooling and, to that end, each rib is fabricated of a stack of plates as shown in exploded fashion in FIG. 5. As illustrated in FIG. 5, each rib stack includes a plurality of impingement orifice plates 66a and 66b, a plurality of spacer plates 68 and a plurality of manifold plates 70a and 70b. First of all, it should be noted that only one impingement orifice plate 66b and two spacer plates 68 are shown in FIG. 5. These plates alternate through the stack and the precise number of alternating orifice plates and spacer plates would depend upon the load requirement or heat dissipating capabilities desired or required of an individual rib 46. In addition, it can be seen that manifold plates 70a,70b are solid on their outsides to define a non-leaking structure with at least one side interfacing surface with appropriate electronic boards.

More particularly, manifold plate 70a at one end of the stack of plates defining an individual rib 46 includes channel means defining a first coolant flow passage, generally designated 72, and a second coolant flow passage, generally designated 74. Flow passage 72 includes an inlet channel 76 opening at an inlet 78 which communicates with one of the passages 58 (FIG. 4). The second coolant flow passage 74 likewise is defined by channel means which include an inlet 80 communicating with one of the passages 62 (FIG. 4) through frame 44. Inlet channel 76 of flow passage 72 then communicates with a transverse channel 82 extending along the rib and communicating with a plurality of branch channels 84. Likewise, inlet 80 of the channel means defining flow passage 74 communicates with a transverse channel 86 extending along the rib and, in turn, communicating with a plurality of branch channels 88. The purpose of this configuration of these channel means for redundant flow paths 72 and 74 in manifold plate 70a will be more apparent hereinafter.

Manifold plate 70b at the opposite end of the stack of plates defining each rib 46 simply is a mirror image of manifold plate 70a at the opposite end of the stack. The flow passages defined by channel means on the inside of manifold plate 70b are shown by dotted lines in FIG. 5, and the mirror image relationship with the channel means of manifold plate 70a is apparent. However, it should be noted that the channel means in manifold plate 70b now defines an outlet 90 for flow passage 72 which communicates with one of the passages 60 (FIG. 4) through frame 44. Likewise, an outlet 92 from flow passage 74 communicates with one of the passages 64 (FIG. 4) through frame 44. Also note the corresponding arrow designations "E" through "H" corresponding to the same flow designation arrows in FIG. 4.

Orifice plates 66a are located immediately inside manifold plates 70a and 70b and could be identical to orifice plates 66b. However, in order to enlarge the capacities of flow passages 72 and 74, orifice plates 66a have transverse channels 94 which align with transverse channels 82 in the manifold plates, and transverse channels 96 which align with transverse channels 86 in the manifold plates. These channels 94 and 96 in orifice plates 66a combine with the mating channels in the manifold plates to enlarge the respective flow paths.

In addition, orifice plates 66a have rectangular arrays of orifices 98 alternating with rectangular arrays of orifices 100 lengthwise of the plates. Orifice arrays 98 line up with inlet channel 76 and branch channels 84 of flow passage 72 in manifold plates 70a,70b. Likewise, orifice arrays 100 line up with branch channels 88 of flow passage 74 in the manifold plates.

Before describing spacer plates 68, it can be seen that orifice plates 66b also have rectangular arrays of orifices 98 and 100 in locations corresponding to the like numbered orifice arrays in plates 66a. The only difference is that orifice plates 66b do not have channels 94 and 96 as in orifice plates 66a.

Spacer plates 68 have a series of rectangular openings 102 alternating with identical rectangular openings 104. Openings 102 are in alignment with orifice arrays 98 in orifice plates 66a,66b and openings 104 are in alignment with orifice arrays 100 in orifice plates 66a,66b.

From the foregoing, it can be understood that orifice plates 66a,66b and spacer plates 68 define an impingement plate type heat exchanger means for exchanging heat between the ribs and the coolant flowing through the stack of plates and provides a very compact and very high intensity cooling system for a modular cold chassis. The orifices in each orifice array 98 in adjacent orifice plates 66a and 66b are misaligned intentionally so that fluid must impinge against a subsequent plate prior to passing through the orifices of that plate, and so on through the heat exchanger means. After passing through the orifices of one orifice plate, the fluid strikes or "impinges" against solid portions of the next orifice plate, moves along that plate and passes through its orifices for impingement upon the subsequent orifice plate, and so on through the stack depending upon the number of center orifice plates 66b. This defined tortuous path extends between the end manifold plates 70a and 70b which define flow passage 72 for distributing fluid to and from the tortuous flow path in a first circuit. The same impingement type tortuous flow path is provided by orifice arrays 100 through orifice plates 66a, 66b for flow passage 74 for a second coolant circuit through each rib.

Figure 6:
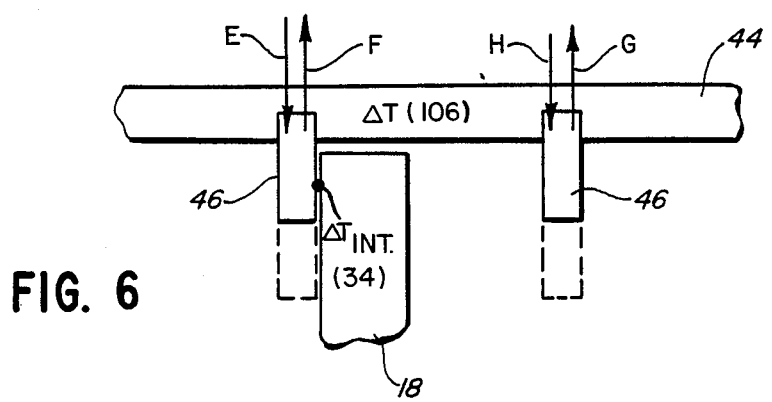
FIG. 6 is a view similar to that of FIG. 2, but illustrating the areas of temperature drops with the ribbed chassis of the invention.

Not only does the heat exchanging rib construction described above provide a highly compact and highly efficient heat exchanging means in comparison to the solid/coolant conduit structures of the prior art, but the flow circuitry through the chassis also greatly diminishes the temperature differential within the system between the thermal interface with the electronic board and the coolant itself. More particularly, reference is made to FIG. 6 in comparison to the schematic illustration of FIG. 2 which shows various temperature drop locations or areas. In FIG. 6, it can be seen that a temperature drop, of course, occurs at the interface 34 between electronic board 18 and rib 46 the same as the like numbered location in FIG. 2. However, because of the efficiency of the impingement plate type heat exchanging structure of the rib itself, there practically is no temperature drop along the rib corresponding to the temperature differential 36 in FIG. 2. There is a small temperature drop, as indicated at 106, as described hereinafter. However, it can be seen that with the chassis of the invention, the coolant flows directly through frame 44 as indicated by arrows "E" and "F" for the first flow circuit and arrows "G" and "H" for the redundant flow circuit. This eliminates the "spread" temperature drop 38 (FIG. 2) and the coolant flow film temperature drop 40 (FIG. 3) of solid/conduit cold chassis of the prior art.

Figure 7:
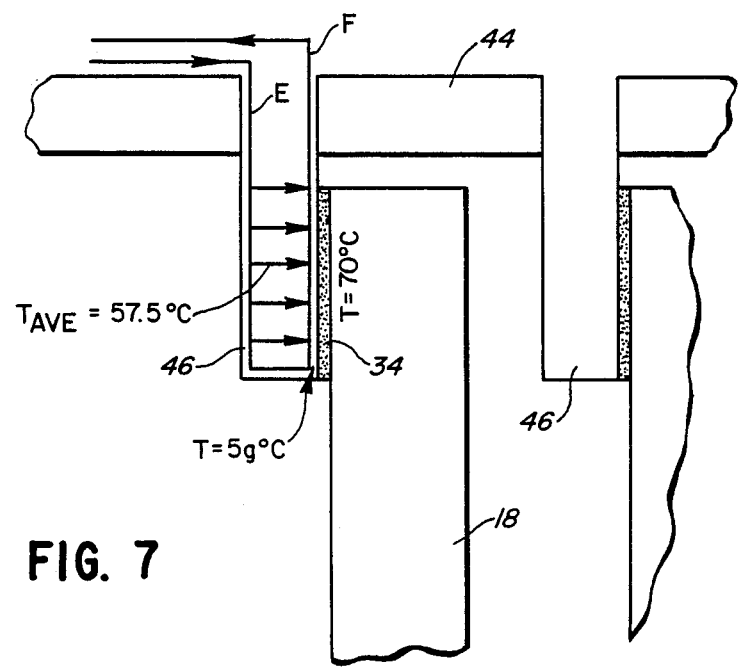
FIG. 7 is a view similar to that of FIG. 3, but illustrating corresponding temperature differential values according to the invention.

FIG. 7 shows a depiction wherein calculated values are applied corresponding to the representation in FIG. 3 of the prior art. It can be seen that with an electronic board 18 having a temperature of 70° C. identical to that in FIG. 3, a similar temperature drop occurs across interface 34 between the board and rib 46, i.e. on the order of 11° C. However, with the efficiency of the impingement plate type heat exchanging structure of the rib in combination with the fact that the fluid flows directly into the rib and directly out from the rib through frame 44, the average temperature throughout the entire distance to the enlarged body of coolant in the manifold is 57.5° C. This results in an overall temperature differential or temperature drop of 12.5° C. in comparison to the 38° C. of prior solid/conduit type chassis constructions. Again, to provide a direct comparison, the calculations depicted in FIG. 7 are based on ribs twice the normal rib height and with two redundant circuits operating, as was done with the calculations of FIG. 3.

In the event that dual or redundant flow circuits are not operating, FIGS. 8 and 9 show illustrations corresponding to FIGS. 3 and 7, respectively, of the prior solid aluminum chassis configuration and the configuration of the invention, respectively, when only one coolant circuit is used. It immediately can be seen that, whereas the system of the invention encounters a temperature differential or drop of only 1.2° C. when using a single circuit system, the prior configuration encounters a substantial increase in temperature differential of 18.5° C. What this really represents is that should a failure in one coolant circuit occur, the prior system encounters a drastic decrease in efficiency as compared to that of the invention. With either one or two coolant circuits operating, it is quite evident that the configurations or systems of the prior art require a much lower coolant temperature to maintain the required interface or "junction" temperature than does the system or configuration of the invention. In other words, the lower thermal gradient conduction differential temperature of the invention allows the use of higher coolant temperatures. The following table illustrates a summary comparison of the aforedescribed advantages of the invention in terms of temperature comparisons. In addition, although the above comparisons were made on the basis of a 180 watt per rib basis, the table adds comparison figures with a 360 watt per rib situation.

|  | THERMAL RESISTANCE °C./WATT | ΔT °C. | $T_{AVE}$ FLUID °C. |
|---|---|---|---|
| PRIOR CONFIGURATION | | | |
| 180 WATT/RIB | 0.21 | 38 | 32 |
| 360 WATT/RIB | 0.21 | 76 | −6 |
| CONFIGURATION OF INVENTION | | | |
| 180 WATT/RIB | 0.07 | 12.5 | 57.5 |
| 360 WATT/RIB | 0.07 | 25 | 45 |

Lastly, the following table summarizes the above comparisons of a fully operating two circuit system versus a situation wherein one circuit might fail.

| 180 WATT/RIB, CONJUNCTION T = 70° C. | | | | |
|---|---|---|---|---|
|  | PRIOR CONFIGURATION | | CONFIGURATION OF INVENTION | |
|  | ΔT °C. | $T_{AVE}$ | ΔT °C. | $T_{AVE}$ |
| TWO CIRCUITS OPERATING | 38 | 32° C. | 12.5 | 57.5 |
| ONE CIRCUIT OPERATING | 56.5 | 13.5° C. | 13.7 | 56.3 |

All of the above temperature comparisons evidence the significant improvements afforded by the invention over conventional modular cold chassis for electronic boards. To maintain the required junction temperature with higher avionics heat loads or with one coolant circuit operating, prior solid configurations require a significantly lower coolant temperature. This lower temperature requires additional coolant conditioning by a refrigeration unit which results in additional cooling system weight and power consumption which is highly undesirable in many applications, such as in aircraft and aerospace applications.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

I claim:

1. A cold chassis for an electronic board in a modular electronic system, comprising a frame having a plurality of projecting ribs defining at least one groove for receiving an edge of the electronic board with the board in engagement with at least one of the ribs, at least the one rib including a plurality of spaced impingement orifice plates defining a tortuous flow path through the one rib, and inlet and outlet means from the frame to the flow path for a cooling fluid to flow through the impingement orifice plates and exchange heat from the electronic board.

2. The cold chassis of claim 1 wherein said inlet and outlet means are formed at an edge of the at least one rib.

3. The cold chassis of claim 1 wherein said one rib includes at least one manifold plate defining at least part of a flow passage means for distributing the cooling fluid to the tortuous flow path.

4. The cold chassis of claim 1 wherein said orifice plates define a pair of tortuous flow paths through the one rib.

5. The cold chassis of claim 4 wherein said one rib includes at least one manifold plate defining at least parts of a pair of flow passage means for distributing cooling fluid independently to each tortuous flow path.

6. The cold chassis of claim 5, including separate inlet and outlet communicating with the flow passage means of the manifold plate.

7. The cold chassis of claim 1 wherein said ribs are disposed on one side of the frame, and including passages directly through the frame from the opposite side thereof communicating with said inlet and outlet means.

8. The cold chassis of claim 7, including manifold means on the opposite side of the frame for distributing cooling fluid to and from said passages.

9. A cold chassis for an electronic board in a modular electronic system, comprising a frame having a plurality of projecting ribs defining at least one groove for receiving an edge of the electronic board with the board in engagement with at least one of the ribs, at least the one rib incluidng a plurality of spaced impingement orifice plates defining a tortuous flow path through the one rib, and at least one manifold plate defining at least part of a flow passage means for distributing the coolant fluid to the flow passage means for distributing the coolant fluid to the tortuous flow path, and inlet and outlet means formed at an edge of the at least one rib communicating a cooling fluid from the frame to the flow passage means of the manifold plate, and thereby, to the impingement orifice plates for exchanging heat from the electronic board.

10. The cold chassis of claim 9 wherein said orifice plates define a pair of tortuous flow paths through the one rib.

11. The cold chassis of claim 10 wherein said at least one manifold plate defines at least parts of a pair of flow passage means for distributing cooling fluid independently to each tortuous flow path.

12. The cold chassis of claim 11, including separate inlet and outlet means communicating with the flow passage means of the manifold plate.

13. The cold chassis of claim 9 wherein said manifold plate has channel means defining said flow passage means, the channel means extending generally parallel to the impingement orifice plates.

14. The cold chassis of claim 13 wherein said channel means extend to and open at a peripheral edge of the manifold plate to define said inlet and outlet means.

15. The cold chassis of claim 9 wherein said ribs are disposed on one side of the frame, and including passages directly through the frame from the opposite side thereof communicating with said inlet and outlet means.

16. The cold chassis of claim 15, including manifold means on the opposite side of the frame for distributing cooling fluid to and from said passages.

17. A cold chassis for an electronic board in a modular electronic system, comprising a frame having a plurality of projecting ribs defining at least one groove for receiving an edge of the electronic board with the board in engagement with at least one of the ribs, at least the one rib including impingement orifice plates, spacer plates and manifold plates, the impingement orifice plates and the spacer plates cooperating to define first and second tortuous flow paths perpendicularly through the plates for independent fluid flow circuits, and the manifold plates, defining at least part of a flow passage means for distributing the liquid to the first and second tortuous flow paths.

18. The cold chassis of claim 17, including inlet means and outlet means from the frame to the flow passage means of the manifold plates.

19. The cold chassis of claim 18 wherein said inlet and outlet means are formed at an edge of the manifold plates interfacing with the frame.

20. The cold chassis of claim 18 wherein said ribs are disposed on one side of the frame, and including passages directly through the frame from the opposite side thereof communicating with said inlet and outlet means.

21. The cold chassis of claim 20, including manifold means on the opposite side of the frame for distributing cooling fluid to and from said passages.

22. In a cold chassis for an electronic board of a modular electronic system wherein modules are plugged in grooves in the chassis to form an assembly, the grooves being formed by ribs, and at least one rib being formed entirely by a stack of plates including impingement orifice plates and manifold plates, the impingement orifice plates defining a tortuous flow path perpendicularly through the plates for a cooling fluid, and the manifold plates defining opposite ends of the stack and including flow passage means for distributing the cooling fluid to the tortuous flow path.

23. In a cold chassis as set forth in claim 22 wherein said manifold plate has channel means defining said flow passage means, the channel means extending generally parallel to the impingement orifice plates.

24. In a cold chassis as set forth in claim 23 wherein said channel means extend to and open at a peripheral edge of the manifold plate to define said inlet and outlet means.

25. In a cold chassis as set forth in claim 22, including inlet means and outlet means from the frame to the flow passage means of the manifold plates.

26. In a cold chassis as set forth in claim 25 wherein said inlet means and outlet means are formed at an edge of the at least one rib interfacing with the frame.

27. In a cold chassis as set forth in claim 26 wherein said inlet means and outlet means are located along a common edge of the stack of plates, and said frame includes header means communicating with the inlet means and the outlet means for directing cooling fluid to and from the flow passages of the manifold plates.

28. The cold chassis of claim 25 wherein said ribs are disposed on one side of the frame, and including passages directly through the frame from the opposite side thereof communicating with said inlet and outlet means.

29. The cold chassis of claim 28, including manifold means on the opposite side of the frame for distributing cooling fluid to and from said passages.

* * * * *